United States Patent
Honda

(10) Patent No.: US 11,043,924 B2
(45) Date of Patent: Jun. 22, 2021

(54) HIGH FREQUENCY MODULE AND COMMUNICATION DEVICE

(71) Applicant: Murata Manufacturing Co., Ltd., Kyoto (JP)

(72) Inventor: Akifumi Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/571,516

(22) Filed: Sep. 16, 2019

(65) Prior Publication Data
US 2020/0014341 A1   Jan. 9, 2020

Related U.S. Application Data

(63) Continuation of application No. PCT/JP2018/008746, filed on Mar. 7, 2018.

(30) Foreign Application Priority Data

Mar. 17, 2017   (JP) .............................. JP2017-052613

(51) Int. Cl.
*H03F 3/68* (2006.01)
*H03F 1/56* (2006.01)
(Continued)

(52) U.S. Cl.
CPC ............. *H03F 1/565* (2013.01); *H03F 3/211* (2013.01); *H03H 7/38* (2013.01); *H03F 3/602* (2013.01);
(Continued)

(58) Field of Classification Search
CPC .... H03F 1/565; H03F 3/211; H03F 2200/387; H03F 2200/451; H03F 2203/21139;
(Continued)

(56) References Cited

U.S. PATENT DOCUMENTS 4,945,317 A * 7/1990 Sato ......................... H03H 7/38
330/116
5,477,188 A * 12/1995 Chawla ................... H03F 1/301
330/269
(Continued)

FOREIGN PATENT DOCUMENTS

| JP | 2006-101103 A | 4/2006 |
|---|---|---|
| JP | 2014-138381 A | 7/2014 |

(Continued)

OTHER PUBLICATIONS

International Search Report Issued in Patent Application No. PCT/JP2018/008746 dated Jun. 5, 2018.
(Continued)

*Primary Examiner* — Khanh V Nguyen
(74) *Attorney, Agent, or Firm* — Pearne & Gordon LLP

(57) ABSTRACT

A high frequency module includes a first amplifier circuit, a second amplifier circuit, a first matching circuit connected to the first amplifier circuit, and a second matching circuit connected to the second amplifier circuit, wherein the first
(Continued)

matching circuit and the second matching circuit are arranged adjacent to each another. The first matching circuit may be provided on an output side of the first amplifier circuit.

16 Claims, 3 Drawing Sheets

(51) Int. Cl.
*H03F 3/21* (2006.01)
*H03H 7/38* (2006.01)
*H04B 1/50* (2006.01)
*H03F 3/60* (2006.01)

(52) U.S. Cl.
CPC .......... *H03F 3/68* (2013.01); *H03F 2200/387* (2013.01); *H03F 2200/451* (2013.01); *H03F 2203/21139* (2013.01); *H03F 2203/21145* (2013.01); *H04B 1/50* (2013.01)

(58) Field of Classification Search
CPC ........... H03F 2203/21145; H03F 3/602; H03F 3/604; H03F 1/0288; H03F 3/191; H03F 1/56; H03F 3/68; H03F 2200/111; H03F 2200/372; H03H 7/38; H03H 7/1766; H03H 7/1758; H03H 7/09; H04B 1/50; H04B 1/0458; H04B 1/0475
USPC ...................................... 330/124 R, 295, 302
See application file for complete search history.

(56) References Cited

U.S. PATENT DOCUMENTS

| | | | | |
|---|---|---|---|---|
| 6,703,080 | B2* | 3/2004 | Reyzelman | H01J 37/32082 |
| | | | | 118/723 E |
| 8,031,003 | B2* | 10/2011 | Dishop | H03F 3/211 |
| | | | | 330/269 |
| 9,866,196 | B2* | 1/2018 | Gorbachov | H03F 1/565 |
| 10,432,236 | B2 | 10/2019 | Ueno | |
| 10,439,588 | B2 | 10/2019 | Kato et al. | |
| 2013/0207732 | A1 | 8/2013 | Cabanillas et al. | |
| 2014/0312978 | A1 | 10/2014 | Nagamori | |
| 2017/0077896 | A1 | 3/2017 | Sugaya | |

FOREIGN PATENT DOCUMENTS

| | | |
|---|---|---|
| JP | 2015-510359 A | 4/2015 |
| JP | 2017-501658 A | 1/2017 |
| WO | 2013-118664 A1 | 8/2013 |
| WO | 2016-136413 A1 | 9/2016 |
| WO | 2016-181701 A1 | 11/2016 |
| WO | 2017-006866 A1 | 1/2017 |

OTHER PUBLICATIONS

Written Opinion Issued in Patent Application No. PCT/JP2018/008746 dated Jun. 5, 2018.

* cited by examiner

PRIOR ART

HIGH FREQUENCY MODULE AND COMMUNICATION DEVICE

This is a continuation of International Application No. PCT/JP2018/008746 filed on Mar. 7, 2018 which claims priority from Japanese Patent Application No. 2017-052613 filed on Mar. 17, 2017. The contents of these applications are incorporated herein by reference in their entireties.

BACKGROUND OF THE DISCLOSURE

1. Field of the Disclosure

The present disclosure relates to high frequency modules and communication devices.

2. Description of the Related Art

Generally, in matching network circuits to be used in high frequency circuits, various techniques are proposed to achieve given characteristics without making its configuration more complex (for example, see Japanese Unexamined Patent Application Publication (Translation of PCT Application) No. 2017-501658 (Patent Document 1) and Japanese Unexamined Patent Application Publication No. 2006-101103 (Patent Document 2)).

FIG. 4 is a circuit diagram of a wideband harmonic wave trap 800 disclosed in the Patent Document 1.

The wideband harmonic wave trap 800 includes a resonant tank 810 constituted of a parallel LC circuit and a resonant tank 820 constituted of a series LC circuit. An input port of the resonant tank 810 and an input port of the resonant tank 820 are connected to a common input 801. An output port of the resonant tank 810 is connected to a load 809 and to ground via a shunt capacitor 830. The load 809 can include an antenna. An output port of the resonant tank 820 is connected to ground.

The wideband harmonic wave trap 800 enables to obtain given stop-band attenuation and stop-band width (specifically, suppression of a second harmonic wave) in a wideband power amplifier.

FIG. 5 is a circuit diagram of a high frequency circuit 900 disclosed in the Patent Document 2.

The high frequency circuit 900 includes a filter 930 having an attenuation pole and inductors 911 and 912 respectively connected to one end portion and the other end portion of the filter 930. The inductors 911 and 912 are arranged in such a manner as to have a positive or negative mutual inductance depending on whether the frequency of the attenuation pole of the filter 930 deviates toward an upper band or a lower band from the given stop-band when the inductors 911 and 912 are not provided. Because of the mutual inductance between the inductors 911 and 912 arranged in such a way, the attenuation pole of the filter 930 moves to a direction in which the deviation from the stop-band decreases.

The high frequency circuit 900 enables to suppress the frequency deviation of the attenuation pole of the filter 930 from the stop-band using the mutual inductance between the inductors 911 and 912, thereby enabling the improvement of circuit characteristics without making the configuration of the high frequency circuit 900 complex.

In a high frequency module including a plurality of high frequency circuits, the downsizing of the whole high frequency module and the improvement of the circuit characteristics can be achieved by independently applying the techniques disclosed in the Patent Documents 1 and 2 to individual high frequency circuits.

BRIEF SUMMARY OF THE DISCLOSURE

However, in a high frequency module including a plurality of high frequency circuits, it is also possible to reduce the overall size of the high frequency module and improve the circuit characteristics by using a means other than independently applying the prior art techniques to individual high frequency circuits.

Therefore, an object of the present disclosure is to provide a high frequency module including a plurality of high frequency circuits and having a small size and excellent circuit characteristics.

In order to achieve the foregoing object, a high frequency module according to one aspect of the present disclosure includes: a first amplifier circuit; a second amplifier circuit; a first matching circuit connected to the first amplifier circuit; and a second matching circuit connected to the second amplifier circuit, wherein the first matching circuit and the second matching circuit are arranged adjacent to one another in such a manner as to attenuate a harmonic wave of a signal traveling through the first matching circuit.

According to this configuration, arranging the first matching circuit and the second matching circuit adjacent to each other enables the first matching circuit not only to perform matching of the first amplifier circuit but also attenuate a given harmonic wave (specifically, a harmonic wave of a signal traveling through the first matching circuit, which is for example a harmonic wave of a signal being amplified in the first amplifier circuit) under the influence of the second matching circuit. That is to say, the first matching circuit not only matches the first amplifier circuit but also functions as a filter that attenuates the given harmonic wave on the basis of circuit characteristics compensated by an element included in the second matching circuit. Here, the circuit characteristics may include, for example, the attenuation band and the amount of attenuation.

Compensating the circuit characteristics of the first matching circuit by intentionally using the influence of the second matching circuit eliminates the need to provide a filter for attenuating the harmonic wave of a signal traveling through the first matching circuit. This enables to constitute the first matching circuit using a smaller number of elements or an element having a smaller constant compared with the case where the influence of the second matching circuit is not present.

Similar things can be said regarding the second matching circuit since the influence between the first matching circuit and the second matching circuit is reciprocal. That is to say, a harmonic wave of a signal traveling through the second matching circuit can also be suppressed by intentionally using the influence of the first matching circuit. As described above, compensating the circuit characteristics of the second matching circuit enables to constitute the second matching circuit using a smaller number of elements or an element having a smaller constant compared with the case where the influence of the first matching circuit is not present.

This enables to obtain the desired circuit characteristics (for example, the circuit characteristics to suppress a given harmonic wave) for each of the first matching circuit and the second matching circuit while reducing the number of elements constituting the first matching circuit and the second matching circuit or element constants. As a result, the high frequency module having a small overall size and excellent circuit characteristics is obtained.

Note that whether the foregoing technique is applied or not can be determined, for example, of a state where the second matching circuit is attached and a state where the second matching circuit is not attached, by detecting a larger attenuation of a harmonic wave of a signal traveling through the first matching circuit in the state where the second matching circuit is attached.

Further, the first matching circuit may include a first element, the second matching circuit may include a second element, and the first element and the second element may be coupled by at least one of electric coupling and magnetic coupling.

According to this configuration, the desired circuit characteristics can be obtained by coupling the element constituting the first matching circuit and the element constituting the second matching circuit. For example, in the first matching circuit and the second matching circuit, the desired circuit characteristics may be obtained by increasing an effective element constant by coupling each other's elements while intentionally using a small inductive or capacitive element whose element constant is insufficient by itself. This enables to obtain the high frequency module having a small overall size and excellent circuit characteristics.

Further, the first element may be a first inductive element connected between an input port and an output port of the first matching circuit, the second element may be a second inductive element connected between an input port and an output port of the second matching circuit, and the first inductive element and the second inductive element may be magnetically coupled.

According to this configuration, the first inductive element and the second inductive element constitute a main path of a signal of the first matching circuit and a main path of a signal of the second matching circuit, respectively. That is to say, the first inductive element and the second inductive element form signal paths in the first matching circuit and the second matching circuit and have large effects on insertion losses of the first matching circuit and the second matching circuit, respectively. Specifically, the larger the inductance values of the first inductive element and the second inductive element are, the larger the insertion losses of the first matching circuit and the second matching circuit are, respectively.

In order to reduce the insertion loss, it is effective to use inductive elements having smaller inductance values for the first inductive element and the second inductive element. On the other hand, when the inductance values of the first inductive element and the second inductive element are reduced, the attenuation bands of the first matching circuit and the second matching circuit move toward a high frequency side. Therefore, there are some concerns that the desired circuit characteristics (for example, attenuation characteristics against a given harmonic wave) may not be obtained.

Therefore, with using the foregoing configuration, an effective inductance value is increased by magnetically coupling the first inductive element and the second inductive element having smaller inductance values by arranging the first inductive element and the second inductive element adjacent to each other. This enables to obtain the attenuation characteristics against a given harmonic wave while limiting the insertion loss of the first matching circuit and the insertion loss of the second matching circuit to smaller values. Mismatching caused by the use of inductive elements having smaller inductance values as the first inductive element and the second inductive element is compensated according to element constants of other elements constituting the first matching circuit and the second matching circuit.

Further, the first matching circuit may further include a first capacitive element connected in parallel to the first inductive element, and the second matching circuit may further include a second capacitive element connected in parallel to the second inductive element.

According to this configuration, the foregoing advantageous effects can be obtained in the first matching circuit and the second matching circuit each being constituted as a LC parallel resonant circuit (so-called resonant tank).

Further, the first matching circuit may be provided on an output side of the first amplifier circuit.

According to this configuration, in the case where the first amplifier circuit is a power amplifier circuit, a harmonic wave caused by non-linearity of the power amplifier can be effectively attenuated.

Further, the first amplifier circuit and the second amplifier circuit may amplify respective signals included in frequency bands different from one other.

According to this configuration, in a multiband high frequency module, the high frequency module having a small overall size and excellent circuit characteristics is obtained by intentionally using the influence of the matching circuit that performs the processing of the other frequency band.

A communication device according to one aspect of the present disclosure includes the foregoing high frequency module and a RF signal processing circuit connected to the high frequency module.

According to this configuration, based on the advantageous effects of the high frequency module described above, the communication device having a small size and excellent circuit characteristics is obtained.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
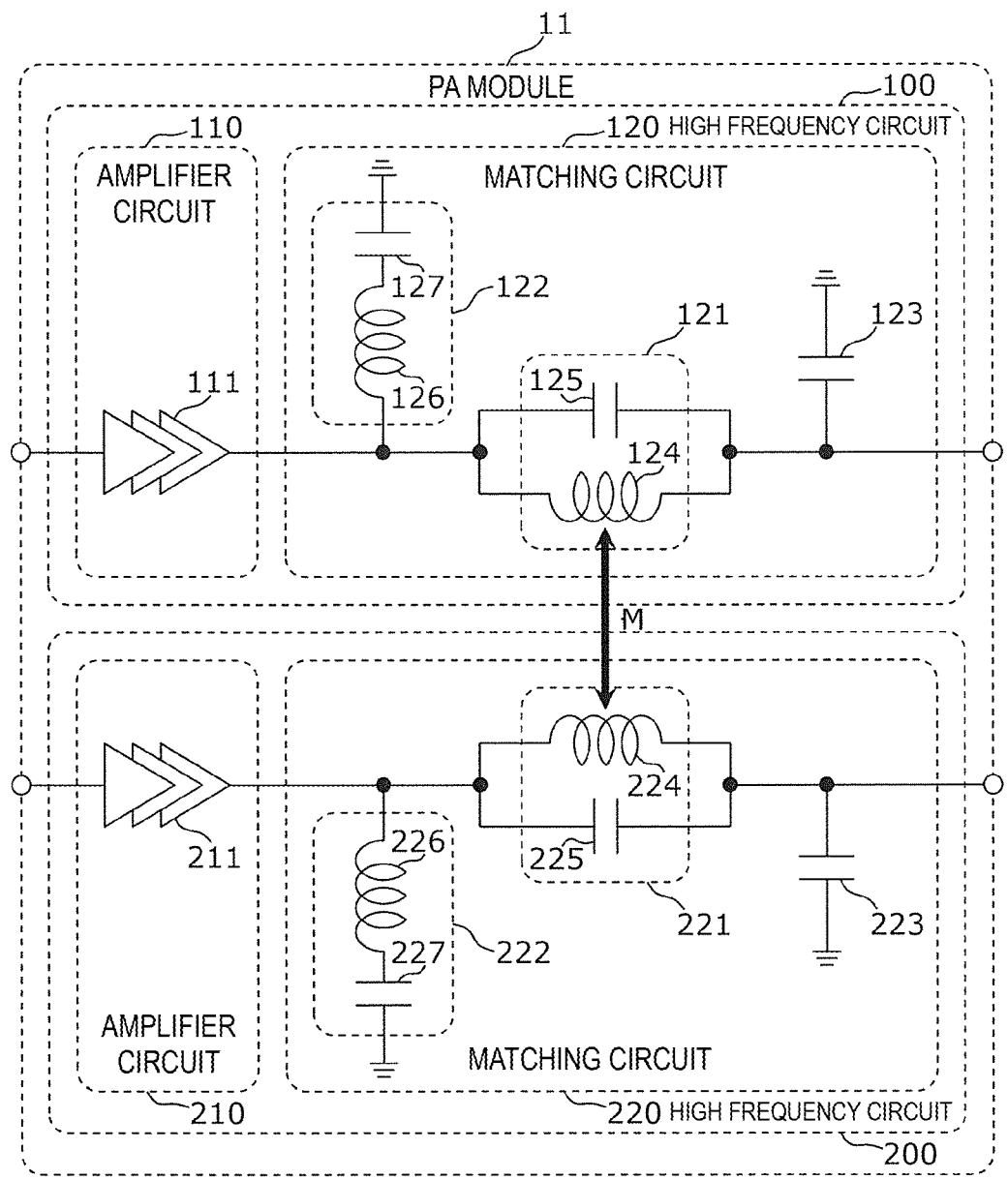
FIG. 1 is a circuit diagram illustrating an example of a configuration of a power amplifier (PA) module according to an embodiment 1.

Embodiments of the present disclosure are described below with reference to the drawings. Note that embodiments which will be described below each illustrate a comprehensive or specific example. Numeric values, shapes, materials, constituting elements, arrangements and connection modes of the constituting elements, and the like described in the following embodiments are mere examples, and not intended to limit the present disclosure. Of constituting elements in the following embodiments, constituting elements that are not described in an independent claim will be described as optional constituting elements. Further, dimensions or ratios of dimensions of constituting elements illustrated in the drawings are not necessarily precise.

Embodiment 1

A high frequency module according to the embodiment 1 is described using an example of a PA module that includes a plurality of high frequency circuits each including an amplifier circuit.

FIG. 1 is a circuit diagram illustrating an example of the configuration of a PA module 11 according to the embodiment 1. The PA module 11 is one example of the high frequency module and may be, for example, realized as a one-chip component.

As illustrated in FIG. 1, the PA module 11 includes high frequency circuits 100 and 200. The high frequency circuit 100 includes an amplifier circuit 110 and a matching circuit 120, and the matching circuit 120 is connected to an output port of the amplifier circuit 110. The high frequency circuit 200 includes an amplifier circuit 210 and a matching circuit 220, and the matching circuit 220 is connected to an output port of the amplifier circuit 210.

The PA module 11 may be, for example, a multiband PA module in which the high frequency circuits 100 and 200 respectively correspond to frequency bands different from each other. In the multiband PA module 11, the amplifier circuits 110 and 210 amplify respective signals included in the frequency bands different from each other.

The amplifier circuits 110 and 210 include amplifying elements 111 and 211, respectively. Each of the amplifying elements 111 and 211 is constituted of one or a plurality of transistor elements.

Figure 4:
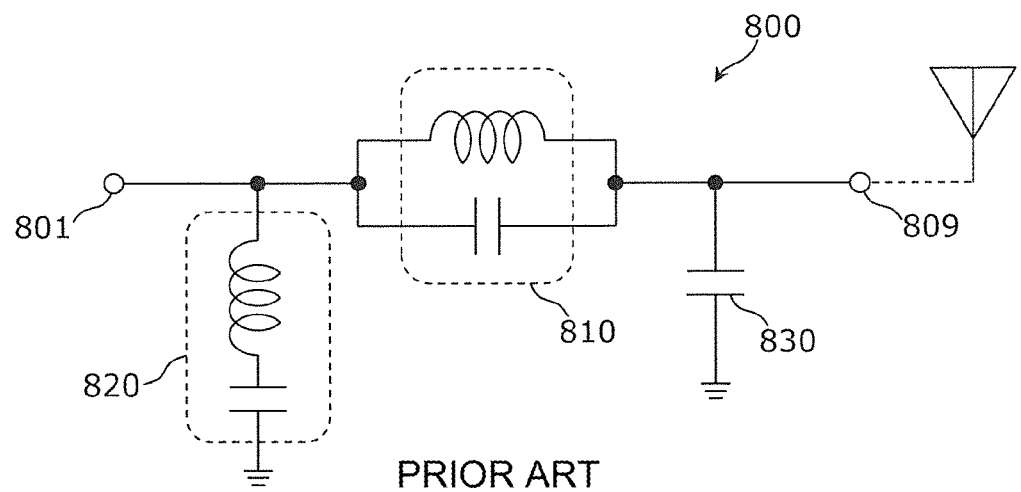
FIG. 4 is a circuit diagram illustrating an example of a prior art wideband harmonic wave trap.
Figure 5:
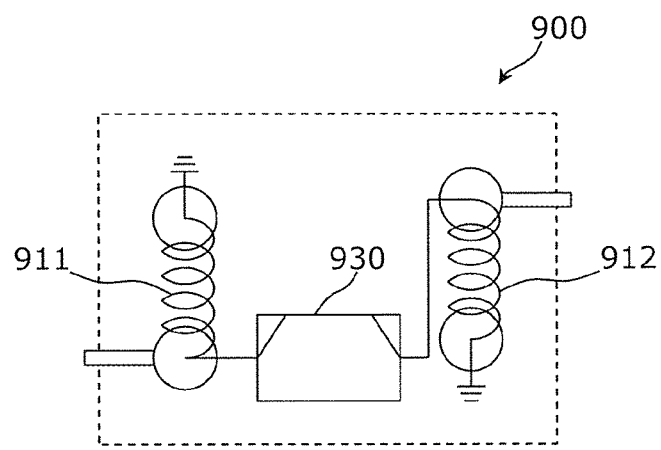
FIG. 5 is a circuit diagram illustrating an example of a prior art high frequency circuit.

The matching circuits 120 and 220 are circuits that respectively match the impedances at output ports of the amplifying elements 111 and 211 and attenuate the undesired signal components. The undesired signal components to be attenuated by the matching circuits 120 and 220 are harmonic waves of signals traveling respectively through the matching circuits 120 and 220, and for example, harmonic waves of signals being amplified in the amplifying elements 111 and 211, respectively. The specific configurations of the matching circuits 120 and 220 are not particularly limited, however, in FIG. 1, a circuit equivalent to the wideband harmonic wave trap 800 of FIG. 4 is illustrated as an example.

The matching circuit 120 is a circuit that performs matching of the amplifier circuit 110. The matching circuit 120 includes resonant tanks 121 and 122 and a capacitor 123. The resonant tank 121 is constituted of a parallel LC circuit formed by connecting an inductor 124 and a capacitor 125 in parallel. The resonant tank 122 is constituted of a series LC circuit formed by connecting an inductor 126 and a capacitor 127 in series.

The matching circuit 220 is a circuit that performs matching of the amplifier circuit 210. The matching circuit 220 includes resonant tanks 221 and 222 and a capacitor 223. The resonant tank 221 is constituted of a parallel LC circuit formed by connecting an inductor 224 and a capacitor 225 in parallel. The resonant tank 222 is constituted of a series LC circuit formed by connecting an inductor 226 and a capacitor 227 in series.

The matching circuits 120 and 220 are arranged adjacent to each other in the PA module 11. Here, "the matching circuits 120 and 220 are adjacent to each other" means that the matching circuits 120 and 220 are electromagnetically adjacent to each other, namely the matching circuits 120 and 220 are arranged at positions in such a way that the matching circuits 120 and 220 can be electromagnetically coupled to each other. Specifically, this means that no structure affecting the electromagnetic coupling exists between an area where the matching circuit 120 is placed and an area where the matching circuit 220 is placed.

Arranging the matching circuits 120 and 220 adjacent to each other allows the matching circuits 120 and 220 affecting each other by coupling the elements respectively included in the matching circuits 120 and 220 using electric coupling, magnetic coupling, or both.

Not only performing matching of the amplifier circuit 110, the matching circuit 120 also functions as a filter that suppresses a harmonic wave of a signal traveling through the matching circuit 120, which is for example a harmonic wave of a signal being amplified in the amplifier circuit 110, under the influence of the matching circuit 220. That is to say, the matching circuit 120 attenuates the harmonic wave on the basis of circuit characteristics compensated by an element included in the matching circuit 220.

Similarly, the matching circuit 220 functions as a filter that suppresses a harmonic wave of a signal traveling through the matching signal 220, which is for example a harmonic wave of a signal being amplified in the amplifier circuit 210, under the influence of the matching circuit 120. That is to say, the matching circuit 220 attenuates the harmonic wave on the basis of circuit characteristics compensated by an element included in the matching circuit 120.

Particularly, in the PA module 11, the inductors 124 and 224 constitute main paths of signals in the matching circuits 120 and 220, respectively. That is to say, the inductors 124 and 224 form signal paths in the matching circuits 120 and 220 and have large effects on insertion losses of the matching circuits 120 and 220, respectively. Specifically, the larger the inductance values of the inductors 124 and 224 are, the larger the insertion losses of the matching circuits 120 and 220 are, respectively.

In order to reduce the insertion loss, it is effective to use inductors having smaller inductance values for the inductors 124 and 224. On the other hand, when the inductance values of the inductors 124 and 224 are reduced, attenuation bands of the matching circuits 120 and 220 move toward a high frequency side. Therefore, there are some concerns that the desired attenuation characteristics, namely the attenuation characteristics against harmonic waves of signals being amplified in the amplifier circuits 110 and 210 may not be obtained.

Therefore, in the PA module 11, an effective inductance value is increased by magnetically coupling the inductors 124 and 224 having smaller inductance values by arranging the inductors 124 and 224 adjacent to each other. This enables to obtain the desired attenuation characteristics while limiting the insertion losses of the matching circuits 120 and 220 to smaller values. Mismatching caused by the use of inductive elements having smaller inductance values as the inductors 124 and 224 is compensated according to element constants of the capacitors 123, 125, 127, 223, 225, and 227 and the inductors 126 and 226, which constitute the matching circuits 120 and 220.

As an example, a case is described in which the inductor 124 of the matching circuit 120 and the inductor 224 of the matching circuit 220 are arranged in such a way that the inductor 124 and the inductor 224 are magnetically coupled with a positive mutual inductance M.

Figure 2:
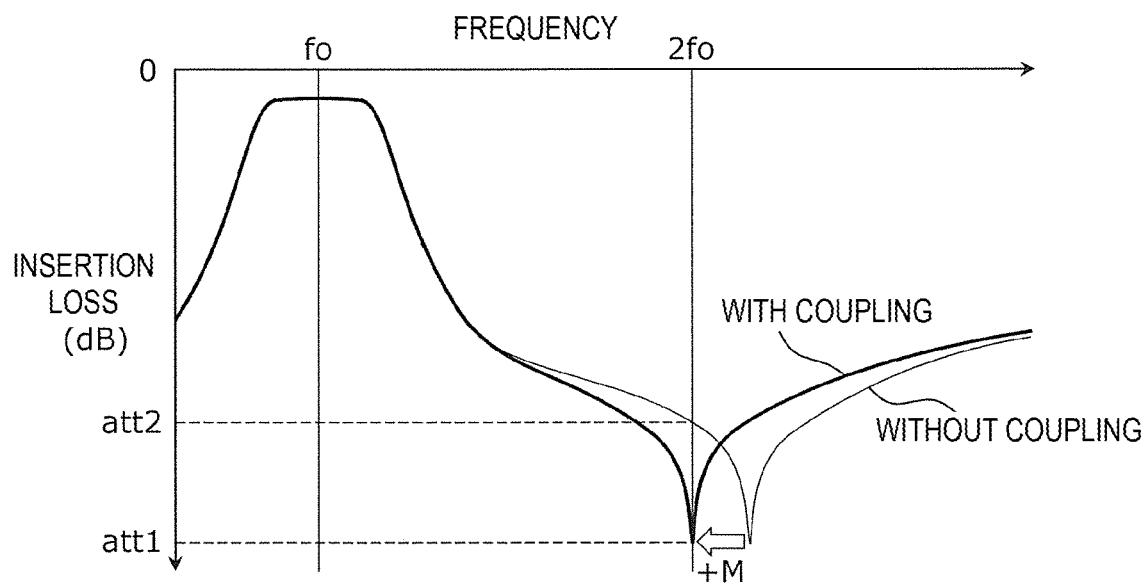
FIG. 2 is a graph conceptually illustrating an example of insertion loss of a matching circuit according to the embodiment 1.

FIG. 2 is a graph conceptually illustrating an example of frequency characteristics of insertion loss of the matching circuit 120. In FIG. 2, the horizontal axis represents the frequency of signal, and the vertical axis represents the insertion loss. Further, fo is a center frequency of a signal being amplified in the amplifier circuit 110, and 2fo is a frequency of a harmonic wave (second harmonic wave as a representative example) of the signal.

The thick line and the thin line in FIG. 2 denote frequency characteristics of the insertion loss in the case where the inductors 124 and 224 are coupled to each other and the case where the inductors 124 and 224 are not coupled to each other, respectively. The frequency characteristic denoted by the thin line corresponds to a frequency characteristic in the case where the matching circuit 220 is removed from the PA module 11 or the position of the matching circuit 220 is changed.

As can be seen from FIG. 2, the matching circuit 120 has a pass-band including the center frequency fo of a signal being amplified in the amplifier circuit 110 and has an attenuation pole at a resonant frequency of the resonant tank 121.

Here, compared with the case where there is no coupling with the inductor 224, the inductance value of the inductor 124 effectively increases by coupling the inductors 124 and 224 with the positive mutual inductance M.

Therefore, the resonant frequency of the resonant tank 121 can be set at twice the center frequency fo by coupling with the inductor 224 while intentionally using, as the inductor 124, a small inductive element whose inductance value is insufficient by itself.

Because of this, an attenuation att1 at a harmonic wave 2fo of the matching circuit 120 is larger than an attenuation att2 at the harmonic wave 2fo of the matching circuit 120 in the case where the matching circuit 220 is removed from the PA module 11 or the position of the matching circuit 220 is changed. That is to say, the attenuation characteristic against the harmonic wave 2fo of the matching circuit 120 can be improved by the contribution of the matching circuit 220.

A similar explanation also holds for the matching circuit 220. That is to say, the resonant frequency of the resonant tank 221 can be set at a given frequency by coupling with the inductor 124 while intentionally using, as the inductor 224, a small inductive element whose inductance value is insufficient by itself.

This enables to obtain the PA module having a small overall size and excellent circuit characteristics.

Generally, an inductive element whose inductance value is small by itself can be configured with low impedance, and thus, using such an inductive element facilitates the suppression of signal loss in the matching circuits 120 and 220. Further, increasing the effective inductance values of the inductors 124 and 224 by coupling the inductors 124 and 224 to each other also helps increase Q values of the resonant tanks 121 and 221.

As described above, according to the PA module 11, the desired characteristics are obtained by intentionally using mutual effect by arranging the matching circuits 120 and 220 adjacent to each other. Specifically, the resonant tank 121 included in the matching circuit 120 operates as a band-stop filter having attenuation characteristics compensated by the inductor 224 included in the matching circuit 220 and attenuates a harmonic wave of a signal traveling through the matching circuit 120, which is for example a harmonic wave of a signal being amplified in the amplifier circuit 110.

Similarly, the resonant tank 221 included in the matching circuit 220 operates as a band-stop filter having attenuation characteristics compensated by the inductor 124 included in the matching circuit 120 and attenuates a harmonic wave traveling through the matching circuit 220, which is for example a harmonic wave of a signal being amplified in the amplifier circuit 210. This enables to constitute, without increasing the number of the elements or the element constants, the first matching circuit 120 that suppresses a harmonic wave traveling through the matching circuit 120 and the second matching circuit 220 that suppresses a harmonic wave traveling through the matching circuit 220.

Note that in the matching circuits 120 and 220, the elements to be coupled intentionally are not limited to the inductors 124 and 224. For example, alternatively, the inductors 126 and 226 may be magnetically coupled to each other, or the capacitors 123 and 223 may be electrically coupled to each other. This increases each of the effective inductance values of the inductors 126 and 226 and the effective capacitance values of the capacitors 123 and 223. As a result, the PA module 11 having a small overall size and excellent circuit characteristics is obtained.

Whether the foregoing technology is applied or not can be determined, for example, of a state where the matching circuit 220 is attached and a state where the matching circuit 220 is not attached, by detecting a larger attenuation of a harmonic wave of a signal traveling through the matching circuit 120 in the state where the matching circuit 220 is attached. That is to say, when the state where the matching circuit 220 is attached and the state where matching circuit 220 is not attached are compared and the attenuation of a harmonic wave of a signal traveling through the matching circuit 120 increases in the state where the matching circuit 220 is attached compared with the state where the matching circuit 220 is not attached, then it can be said that the matching circuit 120 and the matching circuit 220 are arranged adjacent to each other in such a manner as to attenuate the harmonic wave of a signal traveling through the matching circuit 120.

Further, the foregoing configuration may be applied to a matching circuit connected to an input side of an amplifier circuit. The amplifier circuit may be a power amplifier circuit that amplifies a transmitting signal or a low-noise amplifier circuit that amplifies a received signal.

Embodiment 2

In the embodiment 2, a communication device including a front-end circuit including a PA module according to the embodiment 1 is described.

Figure 3:
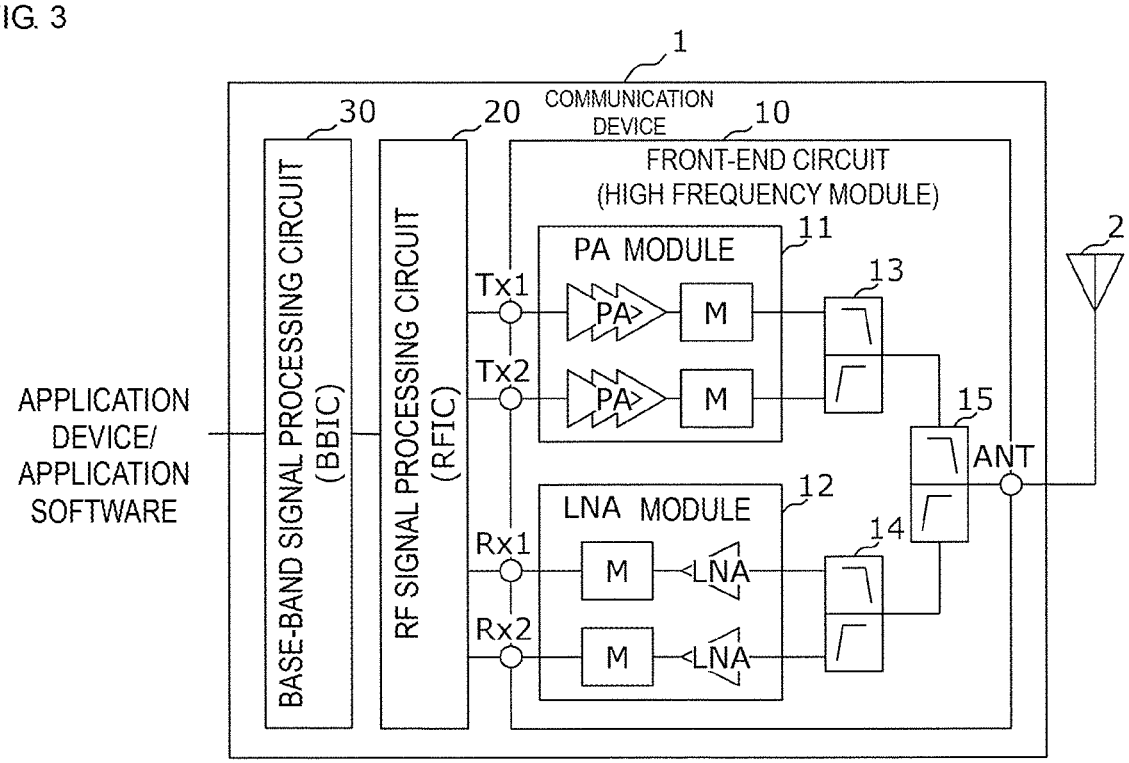
FIG. 3 is a block diagram illustrating an example of a configuration of a communication device including a PA module according to an embodiment 2.

FIG. 3 is a block diagram illustrating an example of a functional configuration of a communication device 1 according to the embodiment 2. As illustrated in FIG. 3, the communication device 1 includes a front-end circuit 10, a RF signal processing circuit 20, and a base-band signal processing circuit 30.

The front-end circuit 10 includes a PA module 11, a low noise amplifier (LNA) module 12, diplexers 13 and 14, and a duplexer 15. As the PA module 11, the PA module 11 described in the embodiment 1 is used. Alternatively, the front-end circuit 10 may be entirely constituted of a single high frequency module.

In the front-end circuit 10, the PA module 11 amplifies the transmitting RF signals Tx1 and Tx2 at respective frequency bands received from the RF signal processing circuit 20. The diplexer 13 multiplexes the amplified transmitting RF signals Tx1 and Tx2 and supplies a resultant signal to the duplexer 15.

The duplexer 15 mixes a transmitting RF signal received from the diplexer 13 with an antenna signal ANT as well as separates a received RF signal from the antenna signal ANT and supplies a resultant signal to the diplexer 14. The antenna signal ANT is transmitted and received by an antenna 2. The antenna 2 may be included in the communication device 1.

The diplexer 14 separates the received RF signals Rx1 and Rx2 at respective frequency bands from the received RF signal separated in the duplexer 15. The LNA module 12 amplifies the separated received RF signals Rx1 and Rx2 at the respective frequency bands and supplies the resultant signals to the RF signal processing circuit 20.

The RF signal processing circuit 20 converts a transmitting signal received from the base-band signal processing circuit 30 into the transmitting RF signals and supplies the transmitting RF signals to the front-end circuit 10. This conversion may include signal modulation and up-converting. Further, the RF signal processing circuit 20 converts the received RF signals received from the front-end circuit 10 into a received signal and supplies the received signal to the base-band signal processing circuit 30. This conversion may include signal demodulation and down-converting. The RF signal processing circuit 20 may be constituted of a high frequency integrated circuit (RFIC) chip.

The base-band signal processing circuit 30 converts the transmitting data generated by an application device or application software that performs voice communication or image display into a transmitting signal and provides it to the RF signal processing circuit 20. This conversion may include data compression, multiplexing, and addition of error correcting codes. Further, the base-band signal processing circuit 30 converts a received signal received from the RF signal processing circuit 20 into received data and provides it to the application device or the application software. This conversion may include data decompression, demultiplexing, and error correction. The base-band signal processing circuit 30 may be constituted of a base-band integrated circuit (BBIC) chip.

According to the communication device 1, a communication device having a small size and excellent circuit characteristics is obtained by using the PA module 11 having a small size and excellent circuit characteristics.

The high frequency module and the communication device according to the embodiments of the present disclosure have been described above, the present disclosure is not limited to these individual embodiments. Embodiments obtained by applying various modifications apparent to those skilled in the art to the present embodiments and embodiments formed by combining constituting elements of different embodiments may be included in the scope of the one or more aspects of the present disclosure as long as they do not depart from the scope of the present disclosure.

The present disclosure can be widely used in various communication devices as high frequency modules.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high frequency module comprising:
   a first amplifier circuit;
   a second amplifier circuit;
   a first matching circuit connected to the first amplifier circuit; and
   a second matching circuit connected to the second amplifier circuit, wherein:
   the first matching circuit and the second matching circuit are arranged adjacent to each another,
   the first matching circuit includes a first capacitive element connected in parallel to a first inductive element, and
   the second matching circuit includes a second capacitive element connected in parallel to a second inductive element.

2. The high frequency module according to claim 1, wherein
   the first matching circuit is connected to an output port of the first amplifier circuit, and
   the second matching circuit is connected to an output port of the second amplifier circuit.

3. The high frequency module according to claim 1, wherein
   the first matching circuit includes a first element,
   the second matching circuit includes a second element, and
   the first element and the second element are coupled by at least one of electrical coupling or magnetic coupling.

4. The high frequency module according to claim 2, wherein
   the first matching circuit includes a first element,
   the second matching circuit includes a second element, and
   the first element and the second element are coupled by at least one of electrical coupling or magnetic coupling.

5. The high frequency module according to claim 3, wherein
   the first element is the first inductive element connected between an input port and an output port of the first matching circuit,
   the second element is the second inductive element connected between an input port and an output port of the second matching circuit, and
   the first inductive element and the second inductive element are magnetically coupled.

6. The high frequency module according to claim 4, wherein
   the first element is the first inductive element connected between an input port and an output port of the first matching circuit,
   the second element is the second inductive element connected between an input port and an output port of the second matching circuit, and
   the first inductive element and the second inductive element are magnetically coupled.

7. The high frequency module according to claim 1, wherein
   the first matching circuit further includes a third inductive element and a third capacitive element connected in series to each other, and the second matching circuit further includes a fourth inductive element and a fourth capacitive element connected in series to each other.

8. The high frequency module according to claim 1, wherein
the first matching circuit further includes a fifth capacitive element, and
the second matching circuit further includes a sixth capacitive element,
wherein the fifth capacitive element and the sixth capacitive element are electrically coupled to each other.

9. The high frequency module according to claim 1, wherein
the first matching circuit is provided on an output side of the first amplifier circuit.

10. The high frequency module according to claim 1, wherein
the second matching circuit is provided on an output side of the second amplifier circuit.

11. The high frequency module according to claim 1, wherein
the first amplifier circuit and the second amplifier circuit amplify, respectively, signals included in frequency bands different from one other.

12. The high frequency module according to claim 2, wherein
the first amplifier circuit and the second amplifier circuit amplify, respectively, signals included in frequency bands different from one other.

13. A communication device comprising:
the high frequency module according to claim 1; and
an RF signal processing circuit connected to the high frequency module.

14. A communication device comprising:
the high frequency module according to claim 2; and
an RF signal processing circuit connected to the high frequency module.

15. A communication device comprising:
the high frequency module according to claim 3; and
an RF signal processing circuit connected to the high frequency module.

16. A communication device comprising:
a base-band signal processing circuit;
the high frequency module according to claim 1; and
an RF signal processing circuit connected to the high frequency module.

* * * * *